United States Patent [19]
Marcus

[11] Patent Number: 5,135,695
[45] Date of Patent: Aug. 4, 1992

[54] POSITIONING, FOCUSING AND MONITORING OF GAS PHASE SELECTIVE BEAM DEPOSITION

[75] Inventor: Harris L. Marcus, Austin, Tex.

[73] Assignee: Board of Regents The University of Texas System

[21] Appl. No.: 670,416

[22] Filed: Mar. 15, 1991

Related U.S. Application Data

[63] Continuation-in-part of Ser. No. 444,882, Dec. 4, 1989, Pat. No. 5,017,317.

[51] Int. Cl.$^5$ .................... B28B 17/00; B29B 13/00; B29C 35/08
[52] U.S. Cl. .................... 264/141; 156/378; 156/379.6; 156/345; 219/121.73; 219/121.83; 425/174.4
[58] Field of Search .................... 425/141, 174, 174.4, 425/143; 264/22.025, 58, 81, 113, 125, 126, 127; 118/715, 50.1, 620, 712; 219/121.6, 121.61, 121.63, 121.64, 121.65, 121.66, 121.73, 121.8, 121.83; 156/62.2, 89, 272.8, 278, 242, 245, 643, 345, 500, 501, 378, 379.6; 250/560, 561; 356/1, 4

[56] References Cited

U.S. PATENT DOCUMENTS

| | | | |
|---|---|---|---|
| 2,599,947 | 6/1952 | Sherman et al. | 118/118 |
| 2,918,896 | 12/1959 | Uhleen | 118/118 |
| 2,961,336 | 11/1960 | Uhleen | 118/118 X |
| 3,063,407 | 11/1962 | Bergstein | 118/104 |
| 3,243,217 | 3/1966 | Baker | 134/122 X |
| 3,279,424 | 10/1966 | Brown et al. | 118/119 |
| 3,280,230 | 10/1966 | Bradshaw | 264/22 |
| 3,301,725 | 1/1967 | Frontera | 156/59 |
| 3,312,191 | 4/1967 | Lowe | 118/104 |
| 3,539,410 | 11/1970 | Meyer | 156/58 |
| 3,848,104 | 11/1974 | Locke | 219/121.6 |
| 3,911,174 | 10/1975 | Rose | 427/211 |
| 3,932,923 | 1/1976 | DiMatteo | 29/407 |
| 3,985,995 | 10/1976 | Brandi | 219/76.1 |
| 4,117,302 | 9/1978 | Earle | 219/121.85 |

(List continued on next page.)

FOREIGN PATENT DOCUMENTS

| | | |
|---|---|---|
| 0130398 | 1/1985 | European Pat. Off. . |
| 0199585 | 10/1986 | European Pat. Off. . |
| 0336672 | 10/1989 | European Pat. Off. . |
| 2263277 | 7/1973 | Fed. Rep. of Germany . |
| 88/02677 | 4/1988 | World Int. Prop. O. . |

OTHER PUBLICATIONS

Massey, A. G., et al., "The Direct Synthesis of Non-Transition-Metal Organo Derivatives", Aldrichimica Acta, vol. 22, No. 2 (1989).

(List continued on next page.)

Attorney, Agent, or Firm—Arnold, White & Durkee

[57] ABSTRACT

A method and apparatus for selectively depositing a layer of material from a gas phase to produce a part comprising a plurality of deposited layers. The apparatus includes a computer controlling a directed energy beam, such as a laser, to direct the laser energy into a chamber substantially containing the gas phase to preferably produce photodecomposition or thermal decomposition of the gas phase and selectively deposit material within the boundaries of the desired cross-sectional regions of the part. For each cross section, the aim of the laser beam is scanned over a target area and the beam is switched on to deposit material within the boundaries of the cross-section. Each subsequent layer is joined to the immediately preceding layer to produce a part comprising a plurality of joined layers. In an alternate embodiment of the present invention, a gas phase is condensed on a surface and a laser beam is used to selectively evaporate, transform, activate or decompose material in each layer. The apparatus of the present invention preferably comprises a computer controlled laser generating and scanning system for selectively depositing or evaporating material to produce a part. The present invention further comtemplates an n-degree of freedom positioning apparatus for positioning a target outer layer and a detecting apparatus which can non-intrusively detect the position and thickness of the deposited layer, both of which are close looped into a computer to produce the desired part.

23 Claims, 4 Drawing Sheets

Primary Examiner—William A. Powell

U.S. PATENT DOCUMENTS

| | | | |
|---|---|---|---|
| 4,135,902 | 1/1979 | Oehrle | 65/2 |
| 4,270,675 | 1/1981 | Wicks et al. | 222/196 |
| 4,292,342 | 9/1981 | Sarma et al. | 427/34 |
| 4,300,474 | 11/1981 | Livsey | 118/641 |
| 4,323,756 | 4/1982 | Brown | 219/121.85 X |
| 4,474,861 | 10/1984 | Ecer | 428/614 |
| 4,503,096 | 3/1985 | Specht | 427/359 |
| 4,540,867 | 9/1985 | Ackerman | 219/121.8 X |
| 4,575,330 | 3/1986 | Hull | 425/174.4 |
| 4,752,352 | 6/1988 | Feygin | 156/630 |
| 4,758,388 | 7/1988 | Hamada et al. | 264/25 |
| 4,818,562 | 4/1989 | Arcella et al. | 427/53.1 |
| 4,863,538 | 9/1989 | Deckard | 156/62.2 |
| 4,888,490 | 12/1989 | Bass et al. | 250/561 |

OTHER PUBLICATIONS

"Sculpting Parts with Light", Machine Design (Mar. 6, 1986), pp. 102–106.

"Laser-Cut Laminations Form Complex Parts", Machine and Tool Bluebook (Apr., 1987).

"Immediate Production of 3-D Objects", Hydronetics, Inc.

"Lasers Carve Complex 3-D Parts", (pp. 1–11).

Sample Cover Letter from Hydronetics, Inc.

Chicago Enterprise, vol. I, No. II (May 1987).

Crane's Chicago Business (1987).

Laser Focus/Electro-Optics, p. 41 (Jun. 1987).

Inside R&D, The Weekly Report on Technical Innovation, vol. 16, No. 19, (May 13, 1987).

Electronic Engineering Times, Issue 430 (Apr. 20, 1987).

Takei, et al., "Rhenium Film Preparation by Laser Melting", Journal of Applied Physics, pp. 2903–2908 (May, 1980).

Deckard, et al., "Solid FreeForm Fabrication and Selected Powder Sintering", Proceedings, 15th Conference on Production Research and Technology, University of California, Berkley (1989) pp. 623–628.

POSITIONING, FOCUSING AND MONITORING OF GAS PHASE SELECTIVE BEAM DEPOSITION

This is a continuation-in-part of U.S. application Ser. No. 07/444,882, filed Dec. 4, 1989, now issued U.S. Pat. No. 5,017,317.

BACKGROUND OF THE INVENTION

I. Field of the Invention

This invention relates to a method and apparatus utilizing a directed energy beam to selectively deposit material from a gas phase or selectively evaporate material condensed from a gas phase to produce a part. In particular, this invention relates to a method of producing a part utilizing a computer-assisted laser or other directed energy beam apparatus which sequentially deposits or evaporates material that was pre-deposited from a gas phase to build a desired part in a layer by layer fashion.

II. Description of the Relevant Art

The economies associated with conventional part production methods are generally related directly to the quantity of parts to be produced and the desired material characteristics of the finished parts. For example, large scale manufacture casting and extrusion techniques are often cost effective, but these production methods are generally unacceptable for small quantities—i.e replacement parts or prototype production. Many such conventional part production methods require expensive part specific tooling. Standard powder processing requires die for shaping the powder, making powder processing unattractive as a method for producing a small number of parts.

Where only a small number of parts are desired, conventional production methods involving a subtractive machining method are usually used to produce the desired part. In such subtractive methods, material is cut away from the starting block of material to produce a more complex shape. Examples of subtractive machine tool methods include: milling, drilling, grinding, lathe cutting, flame cutting, electric discharge machine, etc. While such conventional machine tool subtractive methods are usually effective in producing the desired part, they are deficient in many respects.

First, such conventional machine tool subtractive methods produce a large amount of waste material for disposal. Further, such machine tool methods usually involve a large initial expense for setting up the proper machining protocol and tools. As such, the set-up time is not only expensive, but relies a great deal on human judgment and expertise. These problems are, of course, exacerbated when only a small number of parts are to be produced.

Another difficulty associated with such conventional machining techniques involves tool wear—which not only involves the cost of replacement, but also reduces machining accuracy as the tool wears. Another limit on the accuracy and tolerance of any part produced by conventional machining techniques is the tolerance limits inherent in the particular machine tool. For example, in a conventional milling machine or lathe, the lead screws and ways are manufactured to a certain tolerance, which limits the tolerances obtainable in manufacturing a part on a the machine tool. Of course, the tolerances attainable are reduced with age of the machine tool.

The final difficulty associated with such conventional machine tool subtractive processes is the difficulty or impossibility of making many part configurations. That is, conventional machining methods are usually best suited for producing symmetrical parts and parts where only the exterior part is machined. However, where a desired part is unusual in shape or has internal features, the machining becomes more difficult and quite often, the part must be divided into segments for production. In many cases, a particular part configuration is not possible because of the limitations imposed upon the tool placement on the part. Thus, the size and configuration of the cutting tool do not permit access of the tool to produce the desired configuration.

There are other machining processes which are additive, for example, plating, cladding, and some welding processes are additive in that material is added to a starting substrate. In recent years, other additive-type machining methods have been developed which use a laser beam to coat or deposit material on a starting article. Examples include U.S. Pat. Nos. 4,117,302; 4,474,861; 4,300,474; and 4,323,756. These recent uses of lasers have been primarily limited to adding a coating to a previously machined article. Often such laser coating methods have been employed to achieve certain metallurgical properties obtained only by such coating methods. Typically, in such laser coating methods the starting article is rotated and the laser directed at a fixed location with the coating material sprayed onto the article so that the laser will melt the coating onto the article Additionally, a process for utilizing laser to sinter a powder has been suggested in U.S. Pat. No. 4,863,538 and a process for compressing a powder-based material into a coherent mass prior to sintering has been suggested in U.S. Pat. No. 4,752,352.

A difficulty associated with previously suggested selective sintering methods relates to the problem of evenly depositing the layers of powder for sintering.

SUMMARY OF THE INVENTION

The problems outlined above and problems involved in powder handling in a laser sintering process are in large measure solved by the method and apparatus of the present invention. The present invention provides a method of producing a part on a macroscale or a microscale. A macroscale part typically comprises structural dimensions greater than about 10 microns and may further comprise suspended spans or overhanging structures within the part. A microscale part typically does not contain suspended spans or overhanging structures and may embody structural dimensions less than 10 microns.

A preferred method of the present invention comprises the steps of positioning a first gas phase proximate a target area, scanning the aim of at least one directed energy beam relative to the target area and selectively depositing material from the first gas phase in a first layer on the target area, positioning a second gas phase proximate the target area, scanning the aim of at least one directed energy beam across the target area and selectively depositing material from the second gas phase in a second layer on the target area. This second scanning step further includes the substeps of joining the first and second layers during the scanning and depositing of the second layer and positioning successive gas phases over the target area and scanning the aim of at least one directed energy beam over the target area and selectively depositing material to produce successive layers joined to a previously deposited layer and producing a part comprising a plurality of these joined layers. Successive gas phases, including but not limited to, the first and second gas phases, may comprise substantially identical chemical compositions.

In a preferred embodiment, a non-binding easily removable material enables suspended spans or overhang structures to be formed in a subsequent layer immediately above the easily removable material. A secondary process, including, but not limited to, boiling, shaking, or a selective chemical reaction enables removal of the easily removable material having the suspended span or overhang structure in position.

The present invention may be utilized to produce parts comprising simple or multicomponent metals, ceramics, polymers, composites and combinations thereof.

The gas phases described throughout this application may comprise a plurality of gases including but not limited to organometallic, hydrocarbon, chloride, fluoride, oxide, nitride or polymer precursor gases. As used throughout this document, the term gas phases includes but is not limited to multicomponent gases and gas plasmas. Further, as used throughout this document, the terms gas phase and gas carrier include but are not limited to gases and gas plasmas. Each scanning step preferably either thermally decomposes or photodecomposes the proximate gas phase to deposit material in the target area. Additionally, the wavelength or wavelengths from the energy beam or beams is selectable to selectively deposit material from the desired gas phase. Further, the target area may be selectively heated to selectively deposit material from the gas phase and may further selectively dissociate gas molecules of the gas phase.

Another method of producing a part in accordance with the present invention comprises the steps of positioning a plurality of gas phases proximate a target area, scanning the aim of at least one directed energy beam relative to the target area and selectively depositing material from the gas phases in a first layer on the target area. Subsequently, the aim of at least one directed energy beam is scanned across the target area and material is selectively deposited from the gas phases in a second layer on the target area, including the substeps of joining the first and second layers during the scanning and depositing of the second layer and successively scanning the aim of at least one directed energy beam across the target area and selectively depositing material to produce successive layers joined to a previously deposited layer and producing a part comprising a plurality of joined layers. In a preferred embodiment, the plurality of gas phases comprises gas phase precursor and gas carrier materials and plasmas thereof including but not limited to one or more combinations of $CH_4$, $C_2H_2$, $C_2H_4$, $C_2H_6$, Y $CO_2$, $Al_2(CH_3)_6$, $H_2$, He, Ar, $Ni(CO)_4$, $Fe(CO)_5$, $N_2O$, $SiH_4$, $Si_2H_6$, $TiCl_4$, $BCl_3$ and $WF_6$. Further, the selectively deposited material preferably comprises one or more combinations of directly deposited materials including not limited to amorphous C, graphitic C, diamond, TiN, $Ti_4C_3$, SiC, $Si_3N_4$, $SiO_2$, $TiB_2$, Ni, Al, Fe, W, Si, $Al_2O_3$, $TiO_2$ and TiC. A preferred embodiment enables the direct deposit of composite materials in a predetermined shape.

Each scanning step further comprises the substep of selecting at least one wavelength of the energy beam or beams to selectively deposit material from the plurality of gas phases. In a preferred embodiment the selected beam wavelength enables the selective thermal decomposition of the plurality of gas phases. In another preferred embodiment, the selected beam wavelength enables the selective photodecomposition of the plurality of gas phases. In still another preferred embodiment, the selected beam wavelength enables selective thermal and photo decomposition of the plurality of gas phases. Each scanning step further comprises the substep of selectively heating the target area to selectively deposit material from the gas phases and further to selectively dissociate gas molecules of the gas phases.

The plurality of gas phases preferably comprises a plurality of organometallic, hydrocarbon, chloride, fluoride, oxide, nitride or polymer precursor gases and carrier gases that may participate in the deposition process, including but not limited to He, Ar, $H_2$ and $N_2$.

Yet another method of the present invention comprises the steps of positioning a first gas phase proximate a surface, controlling the temperature of the surface and enabling a portion of the first gas phase to condense in a first layer on the surface and scanning the aim of at least one first directed energy beam relative to across the surface and selectively evaporating material from the first layer. A supplemental first gas phases may, as appropriate, be positioned proximate the surface, condensed and selectively evaporated. The supplemental first gas phase preferably comprises an easily removable material including, but not limited to, $Si_2H_6$, $C_3H_8$, and Ar, enabling suspended spans or overhang structures to be formed in a subsequent layer immediately above the condensed supplemental first gas phase material. The easily removable material utilized in the fabrication of suspended spans and overhand-type structures also includes, but is not limited to, powders.

Subsequently, a second gas phase is positioned proximate the surface. The temperature of the surface is controlled and enables a portion of the second gas phase to condense on the first layer, and the aim of at least one first directed energy beam is scanned across the surface selectively evaporating material from the second layer including the substeps of joining the first and second layers during the condensing and scanning of the second layer and positioning successive gas phases proximate the surface, controlling the temperature of the surface and enabling a portion of the successive gas phases to condense and join in successive layers on the surface, and scanning the aim of at least one first directed energy beam across the surface and selectively evaporating layers of material and producing a part comprising a plurality of joined layers. Further, each scanning step preferably also comprises the step of scanning the aim of at least one second directed energy beam across the surface and selectively decomposing the deposited gas in each layer of material. Additionally, each scanning step preferably further comprises the substep of controlling the wavelength or wavelengths of each directed energy beam or beams.

Following formation of the spans or overhang structures, the easily removable material is preferably removed by a secondary process. A secondary process includes but is not limited to, boiling, shaking, or a selective chemical reaction.

Still another method of the present invention comprises the steps of positioning a first gas phase proximate a surface, controlling the temperature of the surface and enabling a portion of the first gas phase to condense in a first layer on the surface, scanning the aim of at least one first directed energy beam across the surface and selectively transforming material in the first layer into a material having a higher melting temperature than the condensed first gas phase material, positioning a second gas phase proximate the surface, controlling the temperature of the surface and enabling a portion of the second gas phase to condense on the first layer, scanning the aim of at least one first directed energy beam across the surface and selectively transforming material in the second layer into a material having a higher melting temperature than the condensed second gas phase material including the substeps of joining the first and second layers during the condensing and scanning of the second layer and positioning successive gas phases proximate the surface, controlling the temperature of the surface and enabling a portion of the successive gas phases to condense and join in successive layers on the surface and scanning the aim of at least one first directed energy beam across the surface and selectively transforming layers of the material and producing a part comprising a plurality of joined layers. Additionally, each scanning step preferably comprises the further step of scanning the aim of at least one second directed energy beam across the surface and selectively decomposing each layer of material. Each step of scanning preferably further comprises the substep of controlling the wavelengths of at least one directed energy beam.

An additional method of the present invention provides a method of forming an integral three-dimensional object comprising the steps of positioning a target in a chamber substantially able to contain a gas, introducing a gas phase into the chamber, utilizing means for directing an energy beam into the target area to change a property of at least part of the gas phase to deposit a layer of material and repeating the depositing and utilizing steps to form a plurality of these layers each of these layers being integrally bonded to the next adjacent layer by the utilizing steps to form an integral three-dimensional object.

An apparatus of the present invention for producing a part comprises a chamber housing a target area where the chamber enables substantial containment of a gas phase, a system for introducing a gas phase into the chamber, a system for selectively producing at least one directed energy beam, a system for directing the beam to the target area and for scanning the target area with the aim of the beam in a selective pattern, a system for controlling the operation of the beam to selectively deposit material from the gas phase on the target area during the scanning pattern including a computer system operatively coupled to the directing system to monitor the aim of the beam during the scanning pattern. The computer system is preferably programmed with information indicative of the desired boundaries of a plurality of cross-sectional regions of the part, the computer system further preferably being operable for modulating the beam when the aim of the beam is within the desired boundaries of the first cross-sectional region to deposit a first layer of material in the target area, and being able to modulate the beam when the aim of the beam is within the desired boundaries of the second cross-sectional region to deposit a second layer of material and join the first and second layers of material, and the computer system further modulating the beam when the aim of the beam is within succeeding desired boundaries of succeeding cross-sectional regions to deposit succeeding layers of material to join the layers to form the desired part.

Preferably, the computer system is programmed to the desired boundaries of a plurality of serial arranged parallel cross-sectional regions of the part. In an alternative preferred embodiment, the computer system is programmed with the overall dimensions and configuration of the part and the computer system is operative to numerically divide the part into a plurality of serial, parallel, discrete, cross-sectional regions and is able to derive the desired boundaries for each region.

In a preferred embodiment, the scanning system comprises a pair of mirrors driven by respective galvonometers. In another preferred embodiment, the scanning system comprises a system for positioning the target area relative to the beam. Further, in all preferred embodiments of the present invention the directed energy beam preferably comprises at least one laser beam, ion beam, electron beam, focused plasma beam, or combination thereof.

Depositing material in accordance with the present invention avoids problems of leveling and evenly depositing material associated with attempts to mechanically deposit layers of powder in a target area for sintering by a laser beam. Depositing material utilizing the present invention preferably produces level layers joined together to form the desired part. Further, in an alternate embodiment utilizing the present invention to evaporate material condensed from a gas phase to produce the desired part, level layers are also produced and the problems associated with evenly distributing a layer of powder for sintering are largely avoided.

As an alternative in having to withdraw non-binding deposited material in order to produce complex three dimensional parts with spans or overhangs, an alternative preferred embodiment of the present invention comprises a device which can directly produce parts having spans or overhangs without having to withdraw intermediate non-binding layers. In particular, the alternative preferred embodiment allows for placement of the beam upon the outer layer of the target area in any position called upon by the computer system to additively produce select areas of material at various angles in the X, Y or Z direction of the part. Thus, this embodiment comprises a device which can position or rotate the outer layer of the target area along or about the X, Y and/or Z direction so as to receive the energy beam at any position or angle upon the part. By controllably moving or tilting the part as it is being built, the energy beam can deposit material at select X, Y or Z dimensions on the part to build a three-dimensional part with or without a span or overhang. The part can be produced in accordance with a predefined target or template stored within the computer and outputted from the computer to the positioning device. Importantly, the resultant part need not undergo the secondary process to produce an overhang. Further, a plurality of gas phases containing non-binding material is not necessary since only binding material is needed.

This embodiment not only can position the target area, but it can also position the energy beam directed upon the target Thus, the apparatus controllably positions and monitors areas upon which gas phase selective beam deposition occurs by moving the target area and/or the energy beam directed upon the outer layer.

In addition to the target and beam positioning apparatus, the present invention further comprises an apparatus which can detect the spatial position of the outer layer of the target area and the position of the energy beam upon the outer layer to insure that deposition occurs within a relatively select area upon the layer. Still further, the apparatus can measure and monitor the thickness of the material being deposited upon the target and can input readings to the computer which then can reposition the part.

The present invention thereby contemplates an apparatus for producing a part which includes a gas-filled chamber, a target area placed within the gas-filled chamber, at least one energy beam directed upon the target area to produce an outer layer of material, and means for controllably positioning the outer layer relative to the energy beam to selectively deposit the material upon the outer layer at a plurality of angles and dimensions. The energy beam scans the outer layer to nucleate the gas molecules into the material placed upon the outer layer at preselected locations. The gas-filled chamber comprises at least one gas phase selected from the group consisting of organometallic, hydrocarbon, chloride, fluoride, oxide, nitride and polymer precursor gases. Furthermore, the energy beam comprises a laser beam, an ion beam and/or a focused plasma beam.

The positioning means includes a substrate stage releasibly coupled onto the target area. The substrate stage can be moved in either the X, Y or Z axis and pivoted about the X, Y or Z axis. The spatial position of the outer layer can be detected as well as the position of the energy beam upon the outer layer. The stage and the energy beam can be monitored and moved by computer input and motor means such that accurate and precise deposition of material upon the outer layer is achievable. The end result being a part which is fairly complex, built from the inside out, and having one or more overhangs produced directly from gas phase without having to remove one or more non-binding layers subsequent to the gas phase process. The position of the target and/or energy beams is readily achieved with a high degree of precision in a gas-filled environment necessary for the present invention. The target is moved or tilted through a connected stage moveable and pivotable in or about the X, Y or Z axis, whereas the energy beam is moved or scanned across the target area through one or more mirrors movable and pivotable in or about the X, Y or Z axis.

Means for detecting the spatial position of the outer layer of the target area, and the relative position and thickness of the deposition layer before, during and/or after deposition, may include any form of non-intrusive beam interference technique. Various interference techniques can be used which include, but are not limited to, a device which measures light reflected from the layer—the reflected light being in phase or out-of-phase with the impinging light to form, e.g., constructive or destructive interference. In addition to interference techniques, various relative reflection techniques can also be used to measure deposition position and thickness. Reflection techniques often require two impinging light beams directed upon the deposition layer. The operator can guage the layer thickness and position by measuring the relative magnitude of the two resulting reflected beams. Each light beam is modulated at a frequency dissimilar from each other and directed at a common point upon the target area. First and second photodetectors receive scattered light from the outer layer, and computer means coupled to the photodetectors measure the relative strengths of the scattered light beams received within the photodetectors. It is the measured relative strengths of the scattered light which determines if the outer layer of the target area is too close, too far or tilted relative to the optical light source. As material is being deposited upon the target area, the detecting means (either the interference or reflection means) will indicate a relatively precise measurement of the thickness of the layered material as well as the locations upon which the layered material is being deposited. Thus, a top layer thickness and topography can be determined before, during and after deposition.

DETAILED DESCRIPTION OF THE PREFERRED EMBODIMENTS

Figure 3:
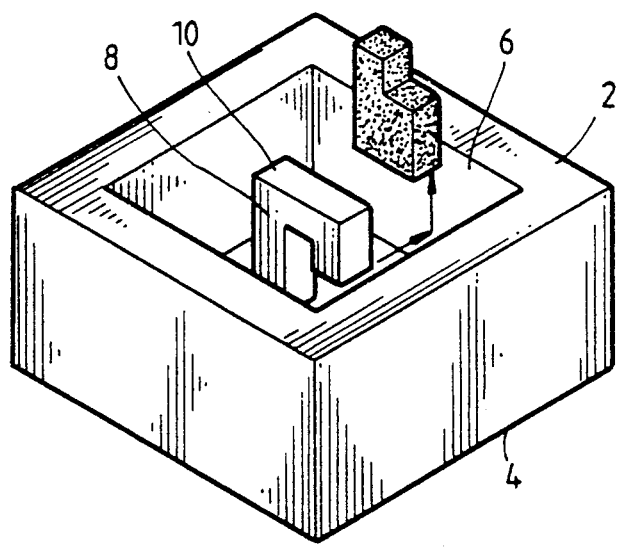
FIG. 3 is a perspective view of the part of FIG. 2.

Turning now to the drawings, the method and apparatus of the present invention enable the fabrication of a variety of parts. The parts fabricated utilizing the present invention are preferably parts with structural dimensions greater than approximately 10 microns. FIG. 3 illustrates such a part. Example part 2 shows outer base structure 4 with cavity 6 positioned within part 2. Pillar 8 and overhand 10 extending from pillar 8 are positioned within cavity 6

Figure 1:
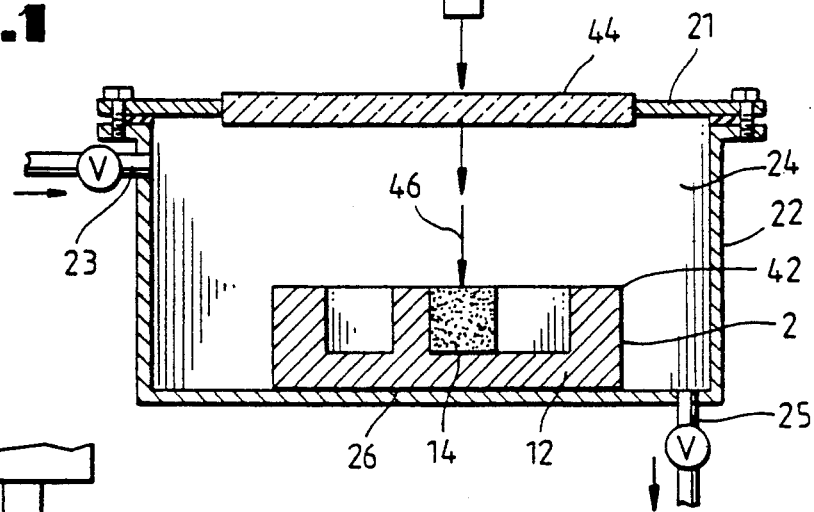
FIG. 1 is a sectional view of a first preferred apparatus and an example part in accordance with the present invention.

FIG. 1 shows part 2 within chamber 22 surrounded by gas phase 24 which is substantially contained in chamber 22. Gas inlet and valve 23 allow gas phase 24 to enter chamber 22. Gas outlet and valve 25 allow gas phase 24 to exit chamber 22. Top of chamber 22 is preferably removable to enable removal of part 2. Gas phase 24 is preferably an organometallic, hydrocarbon, chloride, fluoride, oxide, nitride or polymer precursor gas or a plurality of said gases including but not limited to He, Ar, $H_2$ and $N_2$. Organometallic gases include but are not limited to $Al_2(CH_3)_6$, $Ni(CO)_4$ and $Fe(CO)_5$. Hydrocarbon gases include but are not limited to $CH_4$, $C_2H_2$, $C_2H_4$ and $C_2H_6$. Polymer precursor gases include but are not limited to alkyl halides and amines. A gas phase preferably comprises a gas or gases having the properties of decomposing, sintering and/or polymerizing when exposed to directed energy beams that supply a sufficient thermal, decomposition or dissociation energy.

Figure 2:
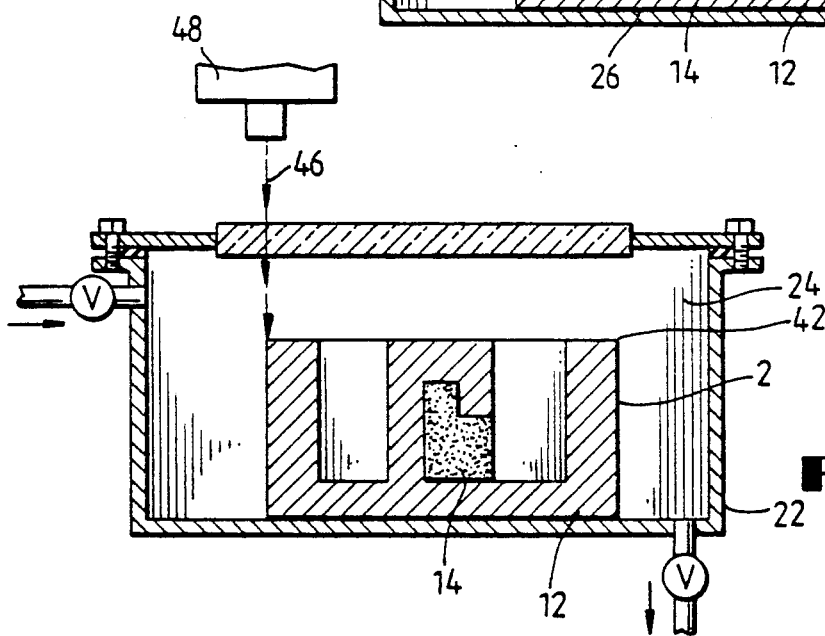
FIG. 2 is a sectional view of the part of FIG. 1, substantially near completion.

FIGS. 1 and 2 show an apparatus for producing parts in accordance with the present invention. By way of example, the part to be produced, part 2, is located within chamber 22. Gas phase 24 is substantially contained within chamber 22. Chamber 22 further comprises a beam transparent window 44 through which laser beam or beams 46 may pass. The laser beam is generated by laser beam generating and scanning system 48 which is controlled by computer control 50. In operation, computer control 50 preferably contains information sufficient to determine the two-dimensional image of each of the plurality of layers to be deposited to form part 2. This information is transferred to laser beam generating and scanning system 48 to control laser beam 46. Laser beam 46 scans each successive top layer 42 during the fabrication of part 2 and is selectively operative to deposit binding material 12 or non-binding material 14 from gas phase 24 in the necessary pattern to produce each layer of part 2. Laser beam 46 will be active where material deposits are necessary to fabricate the current top layer 42 of part 2. Removable top of chamber 21 enables removal of completed part 2 from chamber 22 U.S. Pat. No. 4,863,538 discloses use of a computer to control a laser beam generating and scanning system, the disclosure of which is expressly incorporated herein by reference.

Where it is desired to produce a suspended span or an overhang structure in the part to be formed, preferably a non-binding, easily removable material 14 is deposited in an appropriate layer or layers prior to the first layer defining the suspended span or overhang structure. A non-binding material preferably serves to support the suspended span or overhang structure during fabrication of the part and, due to the non-binding nature of the material, can be easily removed by a secondary process. Removal preferably is performed after fabrication of the part, thereby leaving the suspended span or overhang structure. Successive gas phases 24 enable the successive depositing of binding material 12 and non-binding material 14.

Returning to FIGS. 1 and 2, in a preferred embodiment, gas phase 24 may comprise a plurality of gases or a plurality of gas phases. Laser beam 46 may comprise a single laser beam or a plurality of laser beams coordinated to selectively thermally decompose, photodecompose, or otherwise decompose gas phase 24 to deposit material on target area 26.

The computer control 50 and laser beam generating and scanning system 48 preferably enable control of the amount of energy produced in laser beam 46 and the wavelength of laser beam 46. Therefore, in a preferred embodiment wherein gas phase 24 comprises a plurality of gases, a selected level of energy or a selected wavelength or a combination thereof for laser beam 46 enables the selective decomposition of gas phase 24. The decomposition of gas phase 24 results in the deposition of material from the gas phase on top layer 42 creating a new top layer. A laser beam of differing power or wavelengths than the initial laser beam may then be activated by computer control 50 and laser beam generating and scanning system 48 to decompose a second gas phase and deposit a subsequent top layer of material 42 from the second gas phase. In this preferred embodiment, layers of differing materials may be deposited selectively from the plurality of gases comprising gas phase 24. Clearly, a single layer may contain a first area of a first deposited material and a second area of a second deposited material by providing a first gas phase and selectively scanning the energy beam across the first area and then providing a second gas phase and selectively scanning the energy beam across the second area.

In an alternative preferred embodiment, a single gas phase 24 is placed in chamber 22 through gas inlet and valve 23. Laser beam 46 thermally decomposes or photodecomposes gas phase 24 producing top layer 42. The process may be repeated to produce a second layer or the gas phase may be evacuated from chamber 22 through gas outlet and valve 25 and replaced with another gas phase before a subsequent top layer 42 is deposited.

Additionally, laser beam 46 may selectively heat target area 26 to selective dissociate gas molecules from gas phase 24 and deposit material in target area 26.

By way of example, where the gas phase comprises $C_2H_2$ and $H_2$ and the laser beam has an approximate energy of 20 watts at a wavelength of 0.15 microns (um), the material glassy carbon will be deposited in the target area.

Figure 5:
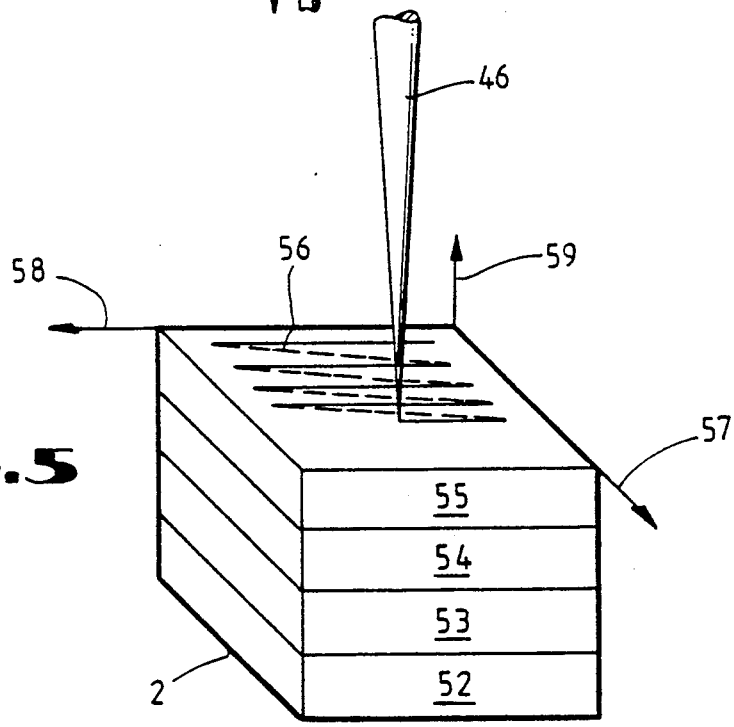
FIG. 5 is a schematic showing a portion of the layered buildup of a part produced in accordance with the present invention, and illustrating a raster scan pattern of the laser beam in the target area.

Still another preferred embodiment of the present invention comprises the steps of positioning a first gas phase 24 proximate target area 26. The temperature of target area 26, and preferably chamber 22, is controlled enabling target area 26 to be at a temperature below that of the walls of chamber 22, enabling a portion of first gas phase 24 to condense in a first layer on the surface of target area 26. Turning additionally to FIG. 5, layer 52 is the first condensed layer of part 2. Laser beam 46 scans target area 26 and selectively evaporates material from layer 52. The process is repeated as shown by layers 53, 54 and 55. FIG. 5 illustrates laser beam 46 scanning layer 55 of material condensed from a gas phase. FIG. 5 illustrates raster scan pattern 56 with beam 46 selectively scanning along axis 58. The selective scan continues as the beam progresses along axis 57 until the desired area has been scanned and the appropriate layer of example part 2 completed. The part is built up, layer by layer, in the direction of axis 59. As in all preferred embodiments of the present invention, the invention enables the creation of suspended spans or overhang structures in a part. As previously described, a non-binding layer or layers of material is deposited to support the suspended span of overhang structure during fabrication. The non-binding material is then removable through a secondary process including but not limited to boiling, shaking or a selective chemical reaction. When the non-binding material is removed, the suspended span or overhang structure remains in the part.

Yet another preferred embodiment of the present invention comprises the steps positioning a first gas phase 24 proximate target area 26. Temperature of target area 26 is controlled and enables a portion of first gas phase 24 to condense in a first layer on the surface of target area 26. Laser beam 46 scans across surface 52, as shown in FIG. 5, and selectively activates material from layer 52. The selectively activated material is transformed into a material having a higher melting temperature than the condensed first gas phase material. The process is repeated. The part is built up, layer by layer, as in all preferred embodiments, where each layer is selectively scanned and joined to the preceding layer. As in all preferred embodiments of the present invention, suspended spans or overhang structures are preferably fabricated in a part by utilizing non-binding material, such as a lower melting temperature phase material, in the layer or layers beneath the suspended spans or overhang structures so that when the temperature of target area 26 is increased, the non-activated condensed gas phase evaporates leaving the selectively activated material deposited.

Where material is condensed on target area 26 prior to scanning, gas phase 24 preferably comprises gases having a boiling point below the controllable ambient temperature of chamber 22. By way of example, gas phase 24 may comprise, but is not limited to, polymer precursors such as $C_2H_2$, $CH_3Cl$ and $(CH_3)_2NH$.

FIG. 5 illustrates the present invention evaporating undesired sections from each layer of part 2. Conversely, FIG. 1 illustrates the selective depositing of material in the appropriate layers of part 2.

Preferred embodiments of the present invention preferably include the substep of joining each layer of a binding material during the buildup process. Where material is selectively deposited, laser 46 deposits each successive layer and joins a newly deposited layer to the previously deposited layer to produce a part comprising a plurality of joined layers.

Where laser beam 46 evaporates condensed material to form a layer, each layer is joined to the previous layer preferably during the condensing of the material. This produces a part comprising a plurality of joined layers.

In all preferred embodiments of the present invention, the computer control is enabled to either determine the boundaries of a plurality of cross-sectional regions of part 2 after being programmed with the desired boundaries of the finished part or is programmed with the desired boundaries of a plurality of serially-arranged, parallel cross-sectional regions of part 2.

Where a plurality of laser beams are utilized in the present invention, the beams may be used in an additive manner to produce a desired energy level or combination of wavelengths at only the point at which the multiple laser beams are focused, referred to as the active point. A preferred embodiment utilizing two laser beams in shown in FIG. 4. Example part 2 is contained in chamber 68 and chamber 68 substantially contains gas phase 24. Computer control 60 preferably controls both first laser beam generating and scanning system 62 and second laser beam generating and scanning system 64. First laser beam 74 from first laser beam system 62 and second laser beam 76 from second laser beam system 64 enter chamber 68 through first beam transparent window 70 and second beam transparent window 72, respectively. First laser beam 74 and second laser beam 76 intersect and are preferably focused at active point 66. Laser beams 74 and 76 are preferably chosen to produce the desired level of laser energy or the desired combination of wavelengths to produce a desired material decomposition producing a material deposition on top layer 42 or part 2.

Where a plurality of laser beams are utilized, gas phase 24 preferably comprises a plurality of gases comprising characteristics enabling thermal decomposition or photodecomposition. Gases comprising these characteristics include, but are not limited to $C_2H_2$, $(CH_3)_2NH$ and $Ni(CO)_4$.

In an alternate preferred embodiment, active point 66 produces a desired evaporation of condensed material from top layer 42. Where a plurality of laser beams are used to evaporate material condensed from gas phase 24, gas phase 24 preferably comprises a plurality of gases comprising characteristics enabling controlled boiling in the areas exposed to the beams. Gases comprising these characteristics include, but are not limited to alkyl halides, amines and hydrocarbons mixed with carrier gases where the carrier gases include but are not limited to He, Ar and $H_2$.

Clearly, a plurality of lasers may be utilized in the present invention and the lasers may be positioned at a plurality of angles about a desired active point. The 90° angle between laser beam 74 and laser beam 76 shown in FIG. 4 is merely illustrative of a particular preferred embodiment utilizing multiple beams and is not a limitation of the method or apparatus of the present invention.

Figure 4:
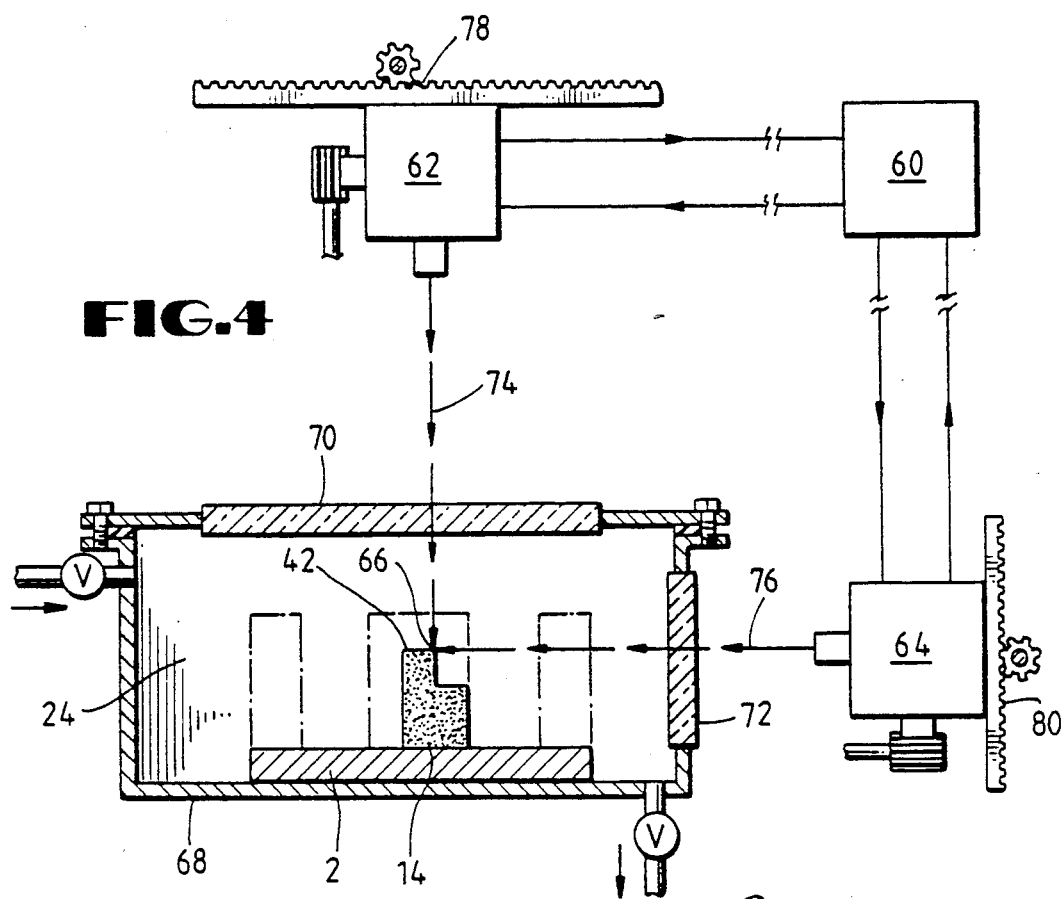
FIG. 4 is a diagram of a second preferred apparatus in accordance with the present invention.

FIG. 4 further illustrates first laser positioner 78 and second laser positioner 80 both preferably controllable by computer control 60. As will be clear to one skilled in the art, controllable mirrors and other known systems are utilizable to control the positions of laser beams 74 and 76.

Figure 6:
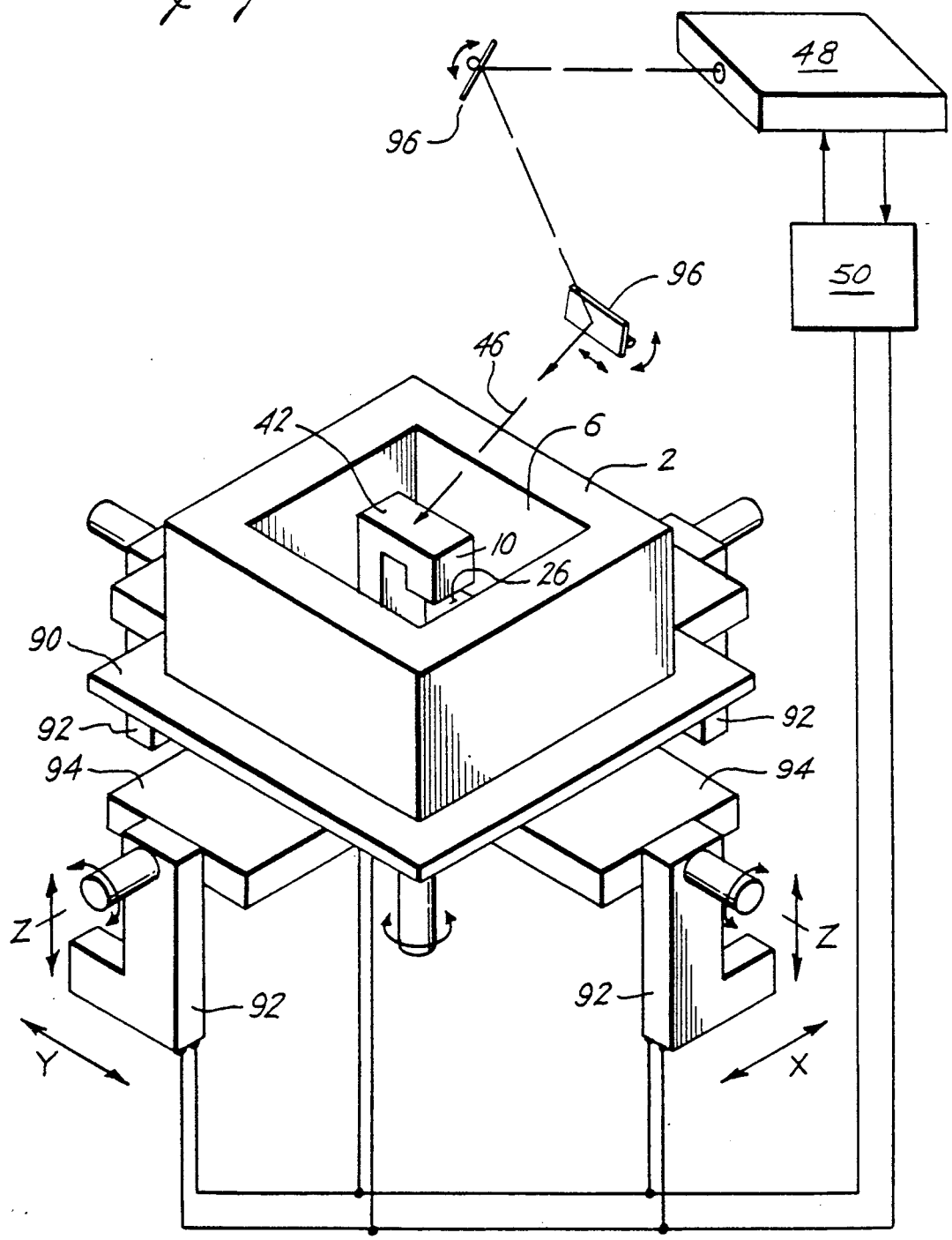
FIG. 6 is a perspective view of a part having a target area mounted upon a movable substrate stage and configured to receive a scanned energy beam of the present invention.

FIG. 6 illustrates a complex part built by a purely additive process from the inside out in order to produce overhang 10. The apparatus of FIG. 6 can controllably position the outer surface of target area 26 relative to energy beam 46 to selectively deposit material upon the outer layer of target 26. The embodiment of FIG. 6 advantageously shows direct deposition of a layer at any position to additively produce a desired overhang 10. Introduction of a plurality of gas phases to produce binding and non-binding layers is therefore not necessary when using the embodiment shown in FIG. 6. Direct production of part 2 is achieved by utilizing a device for positioning target 26 at various X, Y or Z directions or angles of rotation. The device includes a movable and pivotable substrate stage 90 upon which part 2 is releasibly connected. Stage 90 can be moved in either the X, Y or Z directions by any form of conventional means such as, e.g., manual crank, electrical motor and cam, hydraulic cylinder, etc. Further, stage 90 can be rotated about either the X, Y or Z axis in response to input from computer control 50. Conventional forms of stage positioners may be purchased from Klinger Scientific, Stewart Avenue, Garden City, N.Y., or from Onorad Corporation, Oser Avenue, Hauppauge, N.Y. Applicant notes however that many forms of conventional positioning devices cannot be used since they are not of high precision and adaptable for use in a gas-filled chamber of the present invention. Applicant is unaware of positioning devices which can be purchased over-the-counter and are entirely suitable in a gas-filled chamber and are capable of high precision without necessary modifications.

As shown in FIG. 6, risers 92 are capable of moving or pivoting in either the X, Y or Z directions in response to commands from an external source such a computer. Furthermore, mounting brackets 94, rotatably coupled to risers 92, move in accordance with movements of risers 92. Brackets 94 can pivot in response to signal input fed to a respective riser 92 from the external source. Thus, the position of target area 26 can be moved in multiple directions to insure accurate placement of energy beam 46 upon top layer 42. The X and Y rotations of substrate 90 are achieved through two mutually perpendicular arcs for tilt adjustments similar to, e.g., a goniometer head used in X-ray diffractometers.

Also, as a further aid in positioning target area 26 to receive energy beam 46, the energy beam can be positioned and monitored. As shown in FIG. 6, one or more mirrors direct the beam over all the solid angle, in either the X, Y or Z direction. Furthermore, mirrors 96, in conjunction with scanning system 48, function to focus beam 46 in a relatively tight configuration upon outer layer 42. Thus, not only can a relatively complex part 2 be produced, but that part can be produced with relatively close dimensional tolerance in accordance with precise imput from computer 50 and template stored therein.

Figure 7:
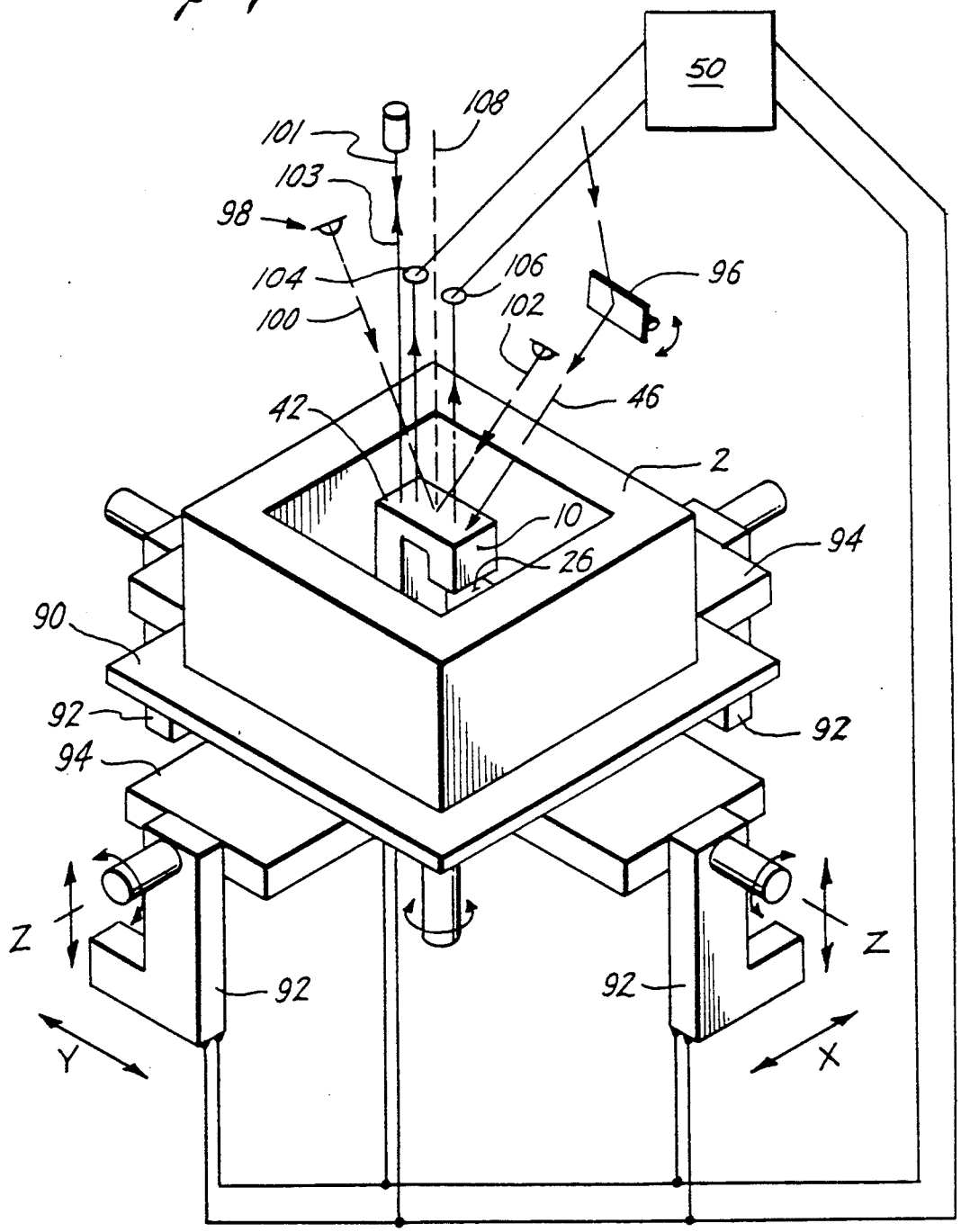
FIG. 7 is a perspective view of a part having a target area whose outer layer spatial location can be detected, monitored and moved by a computer operatively coupled between the detecting means and the moving means.

Referring to FIG. 7, a position monitoring system is shown including movable and pivotable risers 92 along with movable energy beam 46. The movable risers 92 and energy beam 46 are controlled via computer 50 which is coupled between detecting means 98 and movable risers 92. Detecting means 98 allows for a non-intrusive detection of the relative position of outer layer 42 of target area 26. More importantly, detecting means 98 non-destructively tests the dimension of the deposited material upon the outer layer 42 so as to be used in a closed loop form of control of the gas phase selective beam deposition method. The measurements of the instantaneous deposit thickness allows the part to be made to a well controlled geometry. Detecting means 98, being coupled to computer means 50, enables the present invention to define the best geometric approach to making part 2 from the inside out. FIGS. 6 and 7 show part 2 after it has substantially been built.

FIG. 7 illustrates only two forms of detecting means 98 for detecting the position and thickness of outer layer 42. Other non-intrusive forms of spatial detection can certainly be used without departing from the scope and spirit of the present invention. Detection means 98, shown in these exemplary embodiments, includes an interference method and a relative reflectance method. In the interference method, beam 101 is directed upon layer 42 resulting in beam 103 being reflected in a path to either constructively or destructively interfere with the imping wave of beam 101. If the impinging wave and reflected wave are out-of-phase, i.e., one-half wavelength apart, then they will destructively interfere with one another. Conversely if the impinging wave and reflected wave are in-phase, i.e., one wavelength apart, then they will constructively interfere with one another. Depending upon the relatively height of layer 42 with respect to the optical source, the beams will either constructively or destructively interfere with one another. Therefore, the interference technique can non-intrusively measure the position and thickness of layer 42 as it is being grown outwardly.

If detection means includes a relative reflection methodology, reflectance from first and second light beams 100 and 102, respectively, are used to determine relative position and thickness of layer 42. Light beams 100 and 102 are modulated at frequencies dissimilar from each other so that they can be identified when reflected from the outer layer 42 and onto first and second photodetectors 104 and 106, respectively. Depending upon the distance or closeness of outer layer 42 from the photodetectors 104 and 106, or the topography or tilt of outer layer 42, the relative strengths of reflected light beams 100 and 102 will change. For example, if outer layer 42 is tilted toward photodetector 106, more of reflected energy beam 100 will be received in photodetector 106 than of reflected beam 102 received in photodetector 104. This will indicate a relative tilt of outer surface 42 by computer means 50. In response thereto, computer means 50 can instruct risers 92 to pivot or move, to increase or decrease the detected tilt. A more thorough description of non-intrusive spatial detection using the relative reflectance technique as described in U.S. Pat. No. 4,888,490, incorporated herein by reference.

In addition to being able to detect spatial position, computer means 50 also processes relative thickness of the deposited material upon outer layer 42 and the amount of unevenness, or topography, of that deposited layer As the thickness of the deposited layer increases during deposition, outer layer 42 will extend toward the optical source of beam 101, causing light beam 101 to impinge at a different wave position then when deposition was shallower. Also, if reflection technique is used, as deposited layer thickness increases toward the sources of beams 100 and 102, beams 100 and 102 will impinge upon outer layer 42 before they reach the common point or central axis 108. The separate points of impingement of beams 100 and 102 will cause photodetectors 104 and 106 to receive more of one beam than the other. In particular, first photodetector 104 will receive more of first beam 100, and second photodetector 106 will receive more of second beam 102. The relative increase in each photodetector's receipt of one energy beam as opposed to the other energy beam will indicate an increase in outer layer 42 thickness. Advantageously, the present invention allows for continuous and simultaneous monitoring of outer layer 42 thickness before, during and after deposition regardless of what detection technique is chosen.

Further modifications and alternative embodiments of the apparatus and method of the present invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the shape, size and arrangement of parts. For example, equivalent elements or materials may be substituted for those illustrated and described herein, parts may be reversed, and certain features of the invention may be utilized independently of the use of other features, all as would be apparent to one skilled in the art after having the benefit of this description of the invention. Still further, other forms of robotic arm positioning means are contemplated by the applicant, and other forms of detection techniques beyond those described above certainly fall within the scope of the present invention provided, however, that the positioning means provides n-degree of positioning freedom and the detecting means is non-intrusive.

What is claimed is:

1. An apparatus for producing a part in accordance with a target configuration, comprising:
   a gas-filled chamber;
   a target area placed within said gas-filled chamber;
   at least one energy beam directed upon said target area to produce at least one outer layer of material; and
   means for controllably positioning said target area relative to said energy beam to selectively deposit said outer layer of material upon said target area at a plurality of angles and dimensions.

2. The apparatus as recited in claim 1, wherein said energy beam scans said outer layer to nucleate said gas molecules into said material placed upon said outer layer at preselected locations upon said outer layer.

3. The apparatus as recited in claim 1, wherein said gas-filled chamber comprises at least one gas phase selected from the group consisting of organometallic, hydrocarbon, chloride, fluoride, oxide, nitride and polymer precursor gases.

4. The apparatus as recited in claim 1, wherein said at least one energy beam comprises at least one laser beam.

5. The apparatus as recited in claim 1, wherein said at least one energy beam comprises at least one ion beam.

6. The apparatus as recited in claim 1, wherein said at least one energy beam comprises at least one focused plasma beam.

7. The apparatus as recited in claim 1, wherein said positioning means comprises:
a substrate stage releasably coupled onto said target area;
means for moving said stage in the X, Y or Z axis, and for pivoting said stage about the X, Y or Z axis;
means for detecting the spatial position of said outer layer and the position of said energy beam upon said outer layer of material; and
computer means operatively coupled between said detecting means and said moving means for monitoring and changing the position of said stage in accordance with the position of said energy beam.

8. The apparatus as recited in claim 7, wherein said detecting means is non-intrusive.

9. The apparatus as recited in claim 7, wherein said detecting means comprises measurement caused from any form of optical interference technique.

10. The apparatus as recited in claim 7, wherein said detecting means comprises relative interference between an impinging beam and a resulting reflecting beam depending upon the position and thickness of said layer of material.

11. The apparatus as recited in claim 7, wherein said detecting means comprises relative reflection of at least two differently modulated beams from said layer of material and into at least two photodetectors spaced from said layer of material.

12. The apparatus as recited in claim 11, wherein said relative reflection comprises:
a first light beam modulated at a first frequency and directed at a first point upon said target area;
a second light beam modulated at a second frequency and coplanar to said first beam and directed at said first point at a desired position of said target area;
first and second photodetectors for receiving light scattered from said target area; and
said computer means coupled to said photodetectors for measuring the relative strengths of first and second light beams received within said photodetectors and for detecting the relative position of said target area.

13. The apparatus as recited in claim 1, wherein said positioning means comprises means for directing the position of said energy beam in the X, Y or Z axis upon said target area.

14. The apparatus as recited in claim 13, wherein said directing means comprises at least one moveable mirror.

15. The apparatus as recited in claim 13, wherein said directing means comprises at least one pivotable mirror.

16. The apparatus as recited in claim 13, wherein said directing means comprises at least one moveable energy beam source.

17. An apparatus for producing a part comprising:
a chamber housing a target area releasably attached to a moveable stage;
means for introducing at least one gas phase into said chamber;
means for directing at least one energy beam upon said target area to produce at least one outer layer of material and for scanning said outer layer with the aim of said beam in a pattern to selectively deposit at least one layer of material upon said outer layer;
means for controllably moving said stage in the X, Y or Z axis, and for pivoting said stage about the X, Y or Z axis;
means for detecting the spatial position of said outer layer and the position of said energy beam upon said outer layer; and
computer means operatively coupled between said directing means, said moving means and said detecting means for monitoring and changing the position of said stage relative to the position of said energy beam.

18. The apparatus as recited in claim 17, wherein said detecting means comprises measurement caused from any form of optical interference technique.

19. The apparatus as recited in claim 17, wherein said detecting means comprises relative interference between an impinging beam and a resulting reflecting beam depending upon the position and thickness of said layer of material.

20. The apparatus as recited in claim 17, wherein said detecting means comprises relative reflection of at least two differently modulated beams from said layer of material and into at least two photodetectors spaced from said layer of material.

21. The apparatus as recited in claim 20, wherein said relative reflection comprises:
a first light beam modulated at a first frequency and directed at a first point upon said outer layer;
a second light beam modulated at a second frequency dissimilar from said first frequency and directed coplanar and at said first point at a desired position of said outer layer;
first and second photodetectors for receiving light scattered from said outer layer; and
said computer means coupled to said photodetectors for detecting the relative position of said outer layer in accordance with the measurement of the relative strengths of first and second light beams received within said photodetectors.

22. The apparatus as recited in claim 17, wherein said target area is configured to receive plurality of layers of said material in an additive process to produce said part.

23. The apparatus as recited in claim 17, wherein said target area is configured to receive a plurality of layers of said material in an additive process of which at least one of said plurality of layers can be subsequently removed to produce said part.

* * * * *

UNITED STATES PATENT AND TRADEMARK OFFICE
CERTIFICATE OF CORRECTION

PATENT NO. : 5,135,695
DATED : August 4, 1992
INVENTOR(S) : Harris L. Marcus

It is certified that error appears in the above-indentified patent and that said Letters Patent is hereby corrected as shown below:

Column 16, line 55, claim 22, insert between " receive" and "plurality" an --a--.

Signed and Sealed this

Twenty-fourth Day of August, 1993

Attest:

BRUCE LEHMAN

Attesting Officer

Commissioner of Patents and Trademarks